United States Patent
Motoyoshi et al.

(10) Patent No.: US 7,312,661 B2
(45) Date of Patent: Dec. 25, 2007

(54) RF POWER AMPLIFIER

(75) Inventors: Kaname Motoyoshi, Nishinomiya (JP); Masahiko Inamori, Ibaraki (JP); Kazuhiko Ohhashi, Nagaokakyo (JP); Hiroshi Sugiyama, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 282 days.

(21) Appl. No.: 11/204,051

(22) Filed: Aug. 16, 2005

(65) Prior Publication Data

US 2006/0214733 A1    Sep. 28, 2006

(30) Foreign Application Priority Data

Mar. 23, 2005   (JP) .............................. 2005-083400

(51) Int. Cl.
*H03F 3/04*    (2006.01)
(52) U.S. Cl. ...................................................... 330/296
(58) Field of Classification Search ................. 330/296
See application file for complete search history.

(56) References Cited

U.S. PATENT DOCUMENTS 5,321,279 A    6/1994   Khatibzadeh et al.
6,476,668 B2 *  11/2002  Gharpurey et al. ......... 327/538
6,686,801 B1    2/2004   Cho et al.
6,778,018 B2 *  8/2004   Joly et al. ................... 330/296
6,828,861 B2    12/2004  Cho et al.

FOREIGN PATENT DOCUMENTS

| JP | 2002-009558 | 1/2002 |
| JP | 2003-324325 | 11/2003 |
| JP | 2004-080763 | 3/2004 |

\* cited by examiner

*Primary Examiner*—Steven J. Mottola
(74) *Attorney, Agent, or Firm*—McDermott Will & Emery LLP

(57) ABSTRACT

A bias current to be supplied to an amplification circuit 60 is drawn out of a collector of a transistor Q11 of a bias circuit 10. The drawn-out bias current is input to a base of a transistor Q13 via an attenuation filter F2 and is output from an emitter of the transistor Q13 in the state where the voltage thereof is reduced by a level corresponding to Vbe. The attenuation filter F2 is conducted in a DC manner, and attenuates a component of a frequency fH(=2ft−fr) defined by a transmission frequency ft and a receiving frequency fr of a radio frequency signal. The bias current output from the emitter of the transistor Q13 is supplied to the amplification circuit 60 via an attenuation filter F1. The attenuation filter F1 is conducted in a DC manner, and attenuates a component of a frequency fL(=|fr−ft|).

6 Claims, 17 Drawing Sheets

RF POWER AMPLIFIER

BACKGROUND OF THE INVENTION

1. Field of the Invention

The present invention relates to an RF power amplifier useable for an apparatus for transmitting and receiving a radio frequency signal.

2. Description of the Background Art

In general, an RF power amplifier handling radio frequency signals includes, as shown in FIG. 12, an amplification circuit 120 including a plurality of transistors (for example, hetero-junction bipolar transistors) having high radio frequency characteristics, which are connected in parallel, and a bias circuit 110 for supplying a bias current used by the amplification circuit 120. FIG. 12 shows an example of a conventional RF power amplifier having such a configuration (see, for example, Japanese Laid-Open Patent Publications Nos. 2002-9558 and 2003-324325). In the conventional RF power amplifier shown in FIG. 12, a bias current (DC) supply line and a radio frequency signal (RF) input line are connected to a base of each transistor Q.

Conventional RF power amplifiers, represented by the above-described RF power amplifier, have a circuit configuration in which a radio frequency signal and a bias current are supplied to the base of each transistor Q of the amplification circuit 120. With such a circuit configuration, a part of the radio frequency signal leaks from the amplification circuit 120 to the bias circuit 110 via the base connection points (as indicated by the dashed line arrows in FIG. 12). Therefore, when an RF power amplifier having such a configuration is used for an apparatus for transmitting and receiving radio frequency signals, the leak of the radio frequency signals influences the reception of the radio frequency signals by the apparatus as described below.

FIG. 13 is a graph illustrating an exemplary relationship between the transmission frequency/receiving frequency and the output noise in a conventional RF power amplifier (for example, the RF power amplifier shown in FIG. 12). In this specification, the frequency of a radio frequency signal transmitted by the apparatus, i.e., the frequency of a radio frequency signal handled by the amplification circuit 120, will be represented as a "transmission frequency ft"; and the frequency of a radio frequency signal received by the apparatus will be represented as a "receiving frequency fr". For example, according to the FOMA Standards of NTT DoCoMo, Inc. in Japan, the transmission frequency ft=1950 MHz, and the receiving frequency fr=2140 MHz.

By the leak of a radio frequency signal having the transmission frequency ft from the amplification circuit 120, unnecessary frequency components defined by the receiving frequency fr and the transmission frequency ft of the radio frequency signals are generated in the bias circuit 110. These unnecessary frequency components are a component of a difference frequency fL(=|fr−ft|) between the receiving frequency fr and the transmission frequency ft, and a component of a frequency fH (=2ft−fr) which is lower than the transmission frequency ft by the difference frequency fL. These unnecessary components of the frequencies fL and fH are transferred from the bias circuit 110 to the amplification circuit 120 via a supply path of the bias current (as indicated by the solid line arrow in FIG. 12), and exert a serious influence on the output noise superimposing the band of the receiving frequency fr.

SUMMARY OF THE INVENTION

Therefore, an object of the present invention is to provide an RF power amplifier for suppressing the noise superimposing radio frequency signals which are output from an amplification circuit, by using a bias circuit for attenuating unnecessary frequency components before the unnecessary frequency components are transferred to the amplification circuit.

The present invention is directed to an RF power amplifier usable for an apparatus for transmitting and receiving a radio frequency signal. In order to achieve the above-described object, the RF power amplifier according to the present invention comprises an amplification circuit including at least one transistor for receiving a radio frequency signal having a transmission frequency ft at a base thereof and amplifying and outputting the radio frequency signal from a collector thereof; and a bias circuit for supplying a bias current to the base of the transistor included in the amplification circuit by an emitter follower. The bias circuit includes a filter for attenuating at least either one of a difference frequency fL between a receiving frequency fr and a transmission frequency ft of the radio frequency signal, and a component of a frequency fH which is lower than the transmission frequency ft by the difference frequency fL.

As a basic circuit of the bias circuit, the following circuit is conceivable: a circuit comprising a first transistor having an emitter which is grounded; a second transistor having a collector connected to a power supply and an emitter connected to a base of the first transistor; a third transistor having a collector connected to the power supply and a base connected to a collector of the first transistor; a first resistor for connecting a base of the second transistor to the power supply; a second resistor for connecting the collector of the first transistor and the base of the second transistor to each other; a third resistor for grounding the emitter of the second transistor; and a fourth resistor for grounding an emitter of the third transistor; wherein a bias current is supplied from the emitter of the third transistor to the amplification circuit by an emitter follower.

A desirable position of a filter provided in the basic circuit in order to form a bias circuit according to the present invention may be between the emitter of the third emitter and the amplification circuit. The filter may be provided between the collector of the first transistor and the base of the third transistor. The filter may be provided between the first resistor and the power supply. The filter may be provided between the first resistor and the base of the second transistor. The filter may be provided between the base of the first transistor and the emitter of the second transistor. These filter positions can be freely combined.

As described above, according to the present invention, an attenuation filter(s), for attenuating a component of a frequency fL which is a difference frequency between a receiving frequency fr and a transmission frequency ft of a radio frequency signal and a component of a frequency fH which is lower than the transmission frequency ft by the difference frequency fL, is (are) incorporated into the bias circuit. Owing to such a configuration, the output noise of the RF power amplifier in the band of the receiving frequency fr can be reduced.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
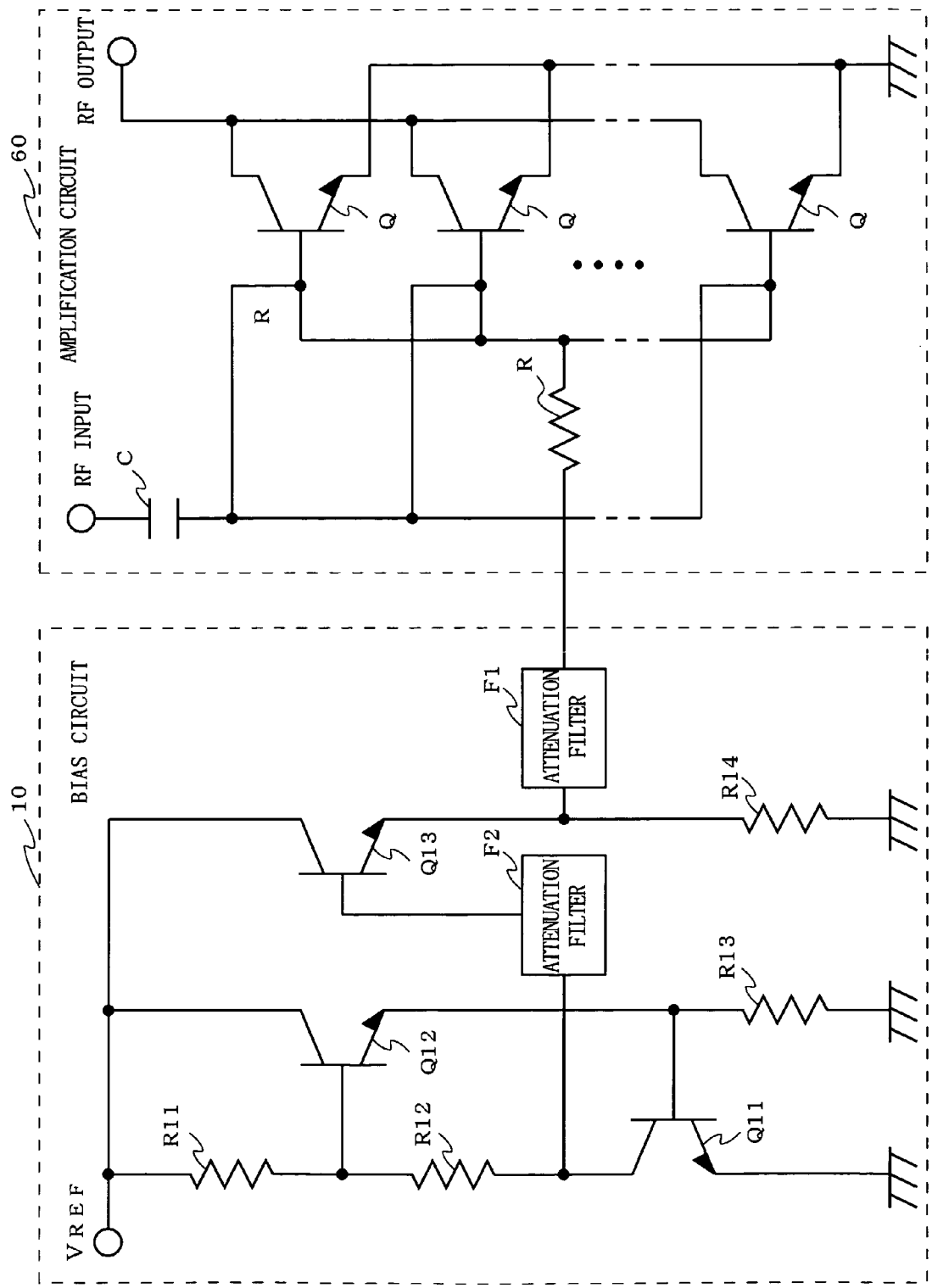
FIG. 1 shows a circuit configuration of an RF power amplifier according to a first embodiment of the present invention.

FIG. 1 shows a circuit configuration of an RF power amplifier according to a first embodiment of the present invention. In FIG. 1, the RF power amplifier according to the first embodiment includes a bias circuit 10 and an amplification circuit 60. The bias circuit 10 may have any basic configuration which uses a transistor such as an emitter follower or the like in a buffer stage. In each of the embodiments of the present invention, the configuration of the bias circuit 110 described above regarding the conventional RF power amplifier is used as a basic configuration of the bias circuit. The amplification circuit 60 may have any basic configuration which includes at least one transistor for receiving a radio frequency signal at a base thereof and amplifying and outputting the radio frequency signal from a collector thereof. In each of the embodiments of the present invention, the configuration of the amplification circuit 120 described above regarding the conventional RF power amplifier is used as a basic configuration of the amplification circuit.

The bias circuit 10 includes transistors Q11 through Q13, resistors R1 through R14, and attenuation filters F1 and F2. A bias source includes the transistors Q11 and Q12 and the resistors R11 through R13. A bias current to be supplied to the amplification circuit 60 is drawn out of a collector of the transistor Q11 of the bias source. The drawn-out bias current is input to a base of the transistor Q13 via the attenuation filter F2 and is output from an emitter of the transistor Q13. The bias current output from the emitter of the transistor Q13 is supplied to the amplification circuit 60 via the attenuation filter F1.

The attenuation filter F1 is for attenuating a component of the frequency fL (=|fr-ft|) which is a difference frequency between the receiving frequency fr and the transmission frequency ft of a radio frequency signal. The attenuation circuit F1 is, for example, a high pass filter for passing a component higher than the frequency fL. The attenuation filter F2 is for attenuating a component of the frequency fH (=2ft-fr) which is lower than the transmission frequency ft by the difference frequency fL. The attenuation filter F2 is, for example, a low pass filter for passing a frequency component lower than the frequency fH. The attenuation filters F1 and F2 pass a DC component.

Figure 2A:
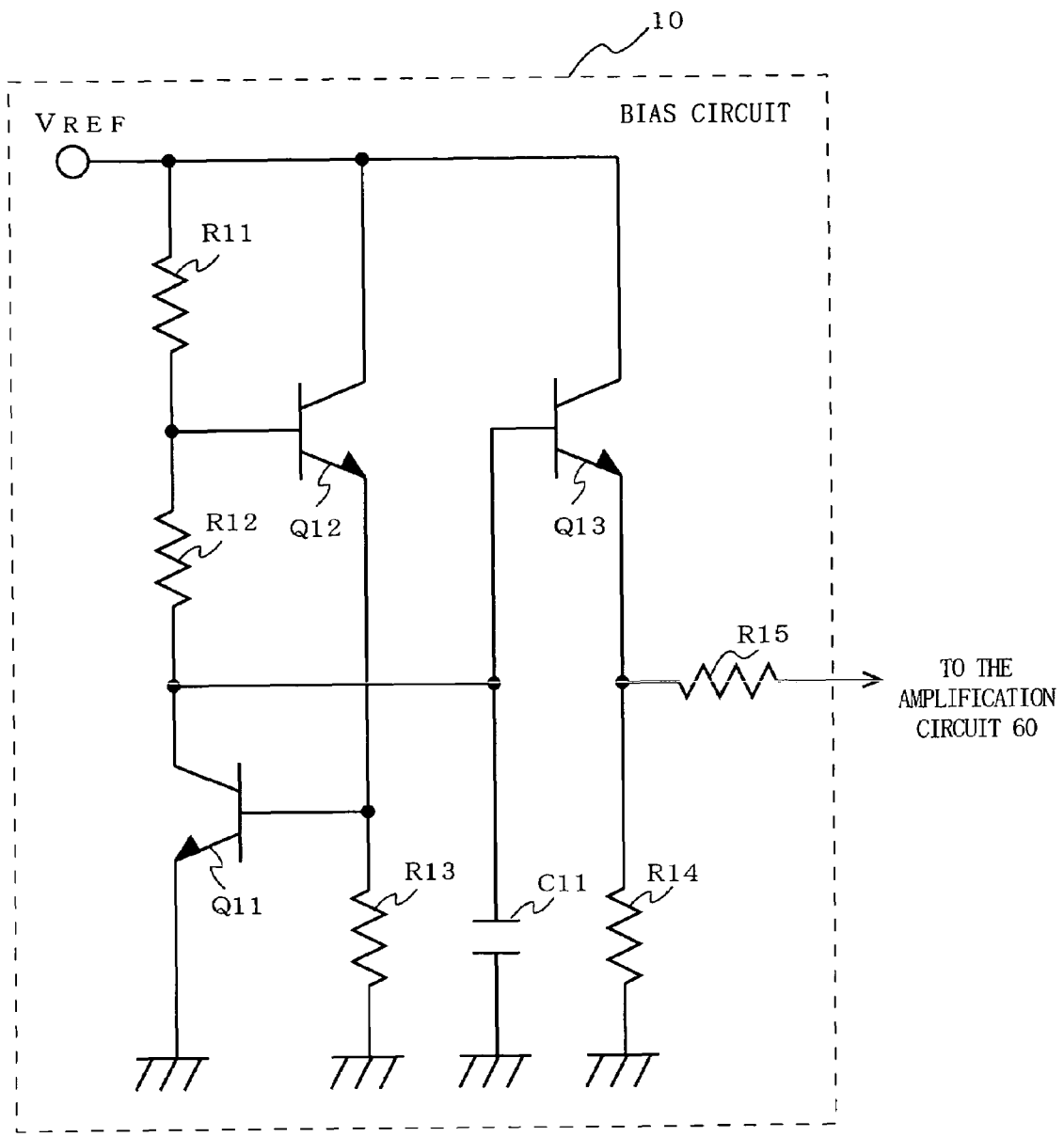
FIG. 2A through FIG. 2C are each a circuit diagram of a bias circuit 10 showing a specific exemplary configuration of attenuation filters F1 and F2.
Figure 2B:
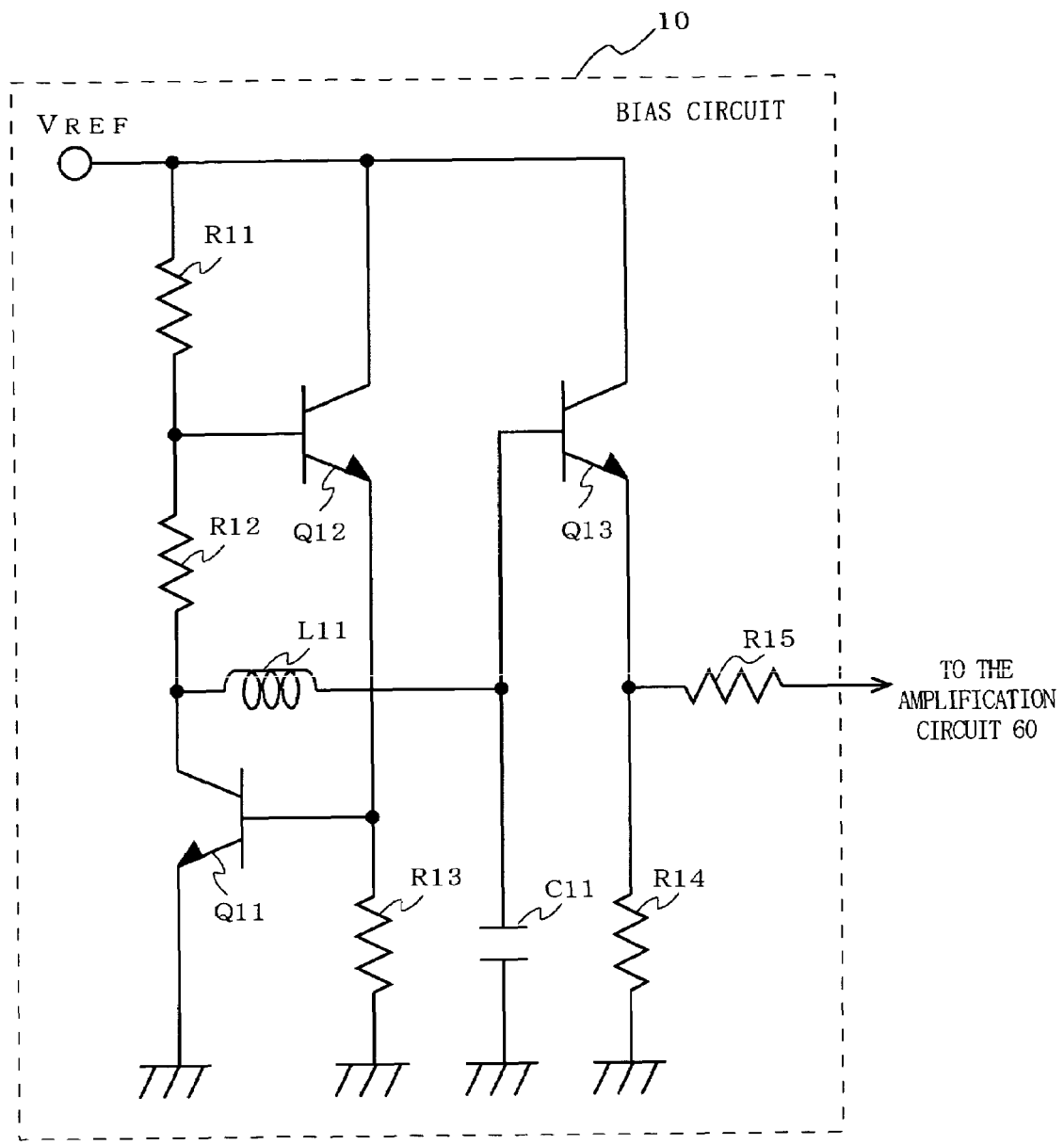
Figure 2C:
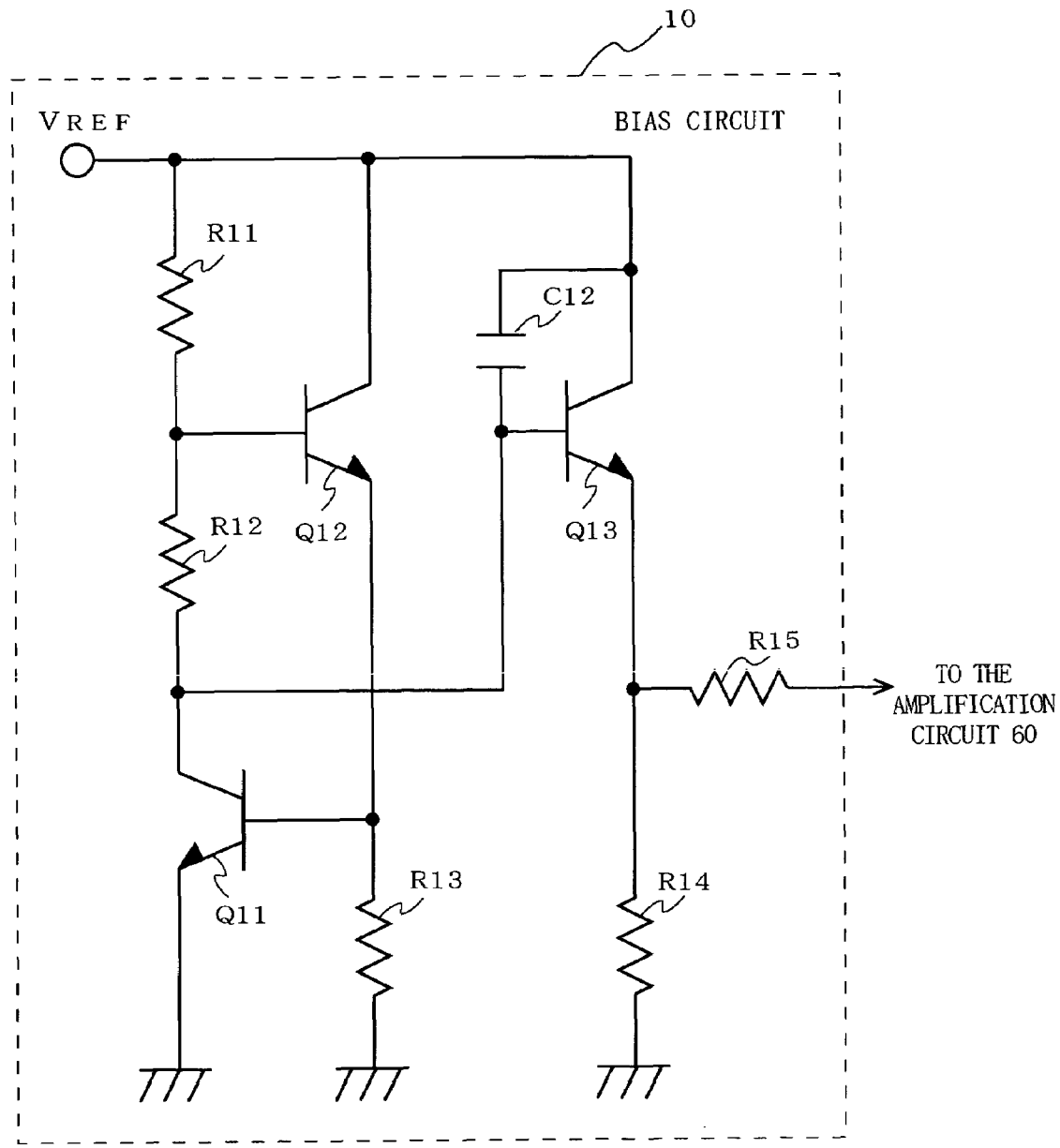

FIG. 2A through FIG. 2C are each a circuit diagram of the bias circuit 10 showing a specific exemplary configuration of the attenuation filters F1 and F2.

In FIG. 2A, the bias circuit 10 uses a resistor R15 as the attenuation filter F1 and a capacitor C11 as the attenuation filter F2. In the bias circuit 10 shown in FIG. 2A, the base of the transistor Q13 is grounded via the capacitor C11. As a result, the frequency fH component of the bias current is attenuated. The bias current is supplied from the emitter of the transistor Q13 to the amplification circuit 60 via the resistor R15. As a result, the frequency fL component of the bias current is attenuated.

In FIG. 2B, the bias circuit 10 uses a resistor R15 as the attenuation filter F1 and an inductor L11 and a capacitor C11 as the attenuation filter F2. In the bias circuit 10 shown in FIG. 2B, the collector of the transistor Q11 and the base of the transistor Q13 are connected to each other via the inductor L11, and the base of the transistor Q13 is grounded via the capacitor C11. As a result, the frequency fH component of the bias current is attenuated. The bias current is supplied from the emitter of the transistor Q13 to the amplification circuit 60 via the resistor R15. As a result, the frequency fL component of the bias current is attenuated.

In FIG. 2C, the bias circuit 10 uses a resistor R15 as the attenuation filter F1 and a capacitor C12 as the attenuation filter F2. In the bias circuit 10 shown in FIG. 2C, the base of the transistor Q13 is connected to a power supply VREF via the capacitor C12. As a result, the frequency fH component of the bias current is attenuated. The bias current is supplied from the emitter of the transistor Q13 to the amplification circuit 60 via the resistor R15. As a result, the frequency fL component of the bias current is attenuated.

Second Embodiment

Figure 3:
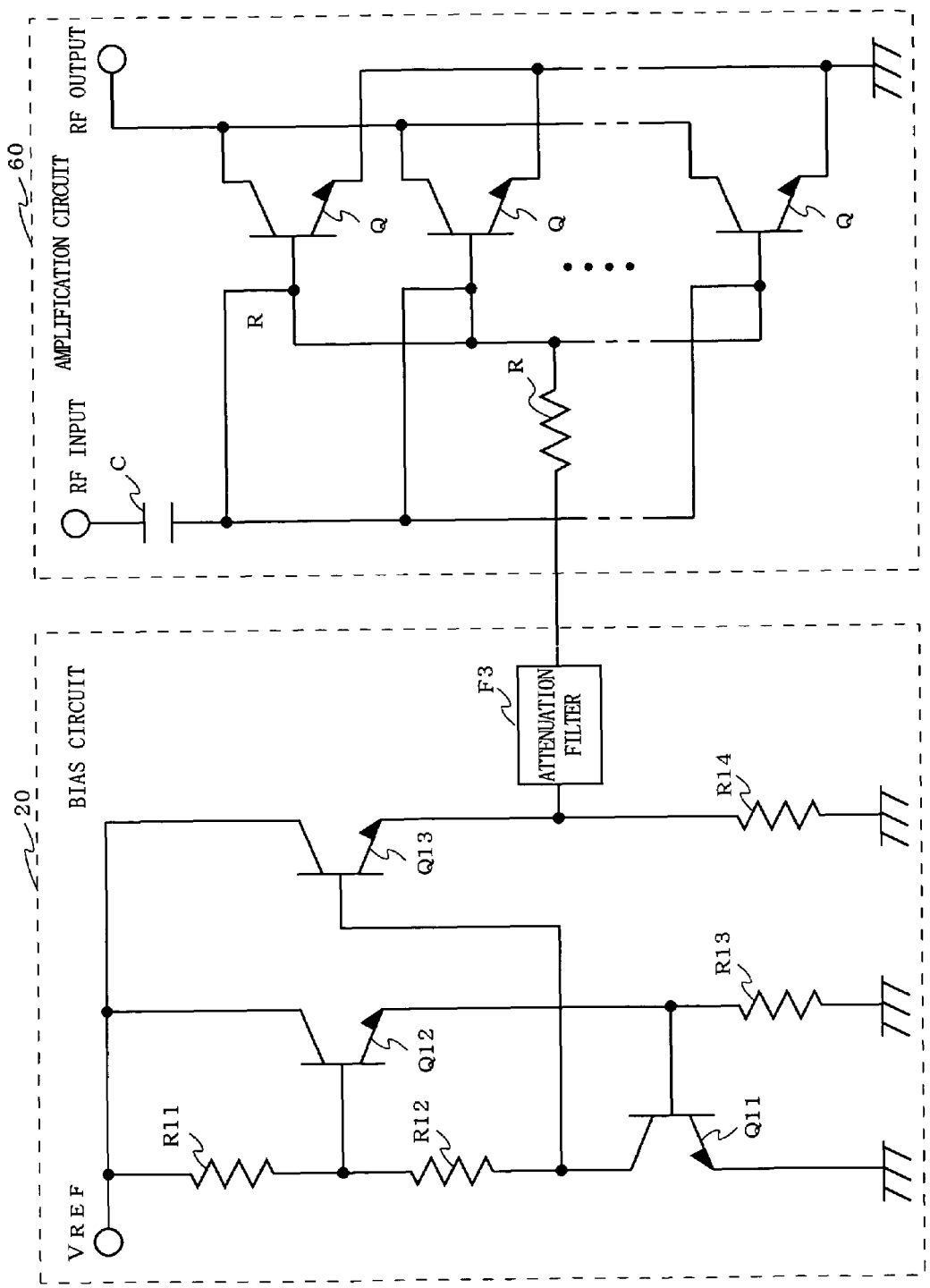
FIG. 3 shows a circuit configuration of an RF power amplifier according to a second embodiment of the present invention.

FIG. 3 shows a circuit configuration of an RF power amplifier according to a second embodiment of the present invention. In FIG. 3, the RF power amplifier according to the second embodiment includes a bias circuit 20 and an amplification circuit 60. The bias circuit 20 may have any basic configuration which uses a transistor such as an emitter follower or the like in a buffer stage, like the bias circuit 10.

The bias circuit 20 includes transistors Q11 through Q13, resistors R11 through R14, and an attenuation filter F3. A bias source includes the transistors Q11 and Q12 and the resistors R11 through R13. A bias current to be supplied to the amplification circuit 60 is drawn out of a collector of the transistor Q11 of the bias source. The drawn-out bias current is input to a base of the transistor Q13 and is output from an emitter of the transistor Q13. The bias current output from the emitter of the transistor Q13 is supplied to the amplification circuit 60 via the attenuation filter F3.

The attenuation filter F3 is for collectively attenuating a component of the frequency fL which is a difference frequency between the receiving frequency fr and the transmission frequency ft of a radio frequency signal and a component of the frequency fH which is lower than the transmission frequency ft by the difference frequency fL. The attenuation filter F3 is, for example, a combination of a high pass filter for passing a frequency component higher than the frequency fL and a low pass filter for passing a frequency component lower than the frequency fH. The attenuation filter F3 passes a DC component.

Figure 4:
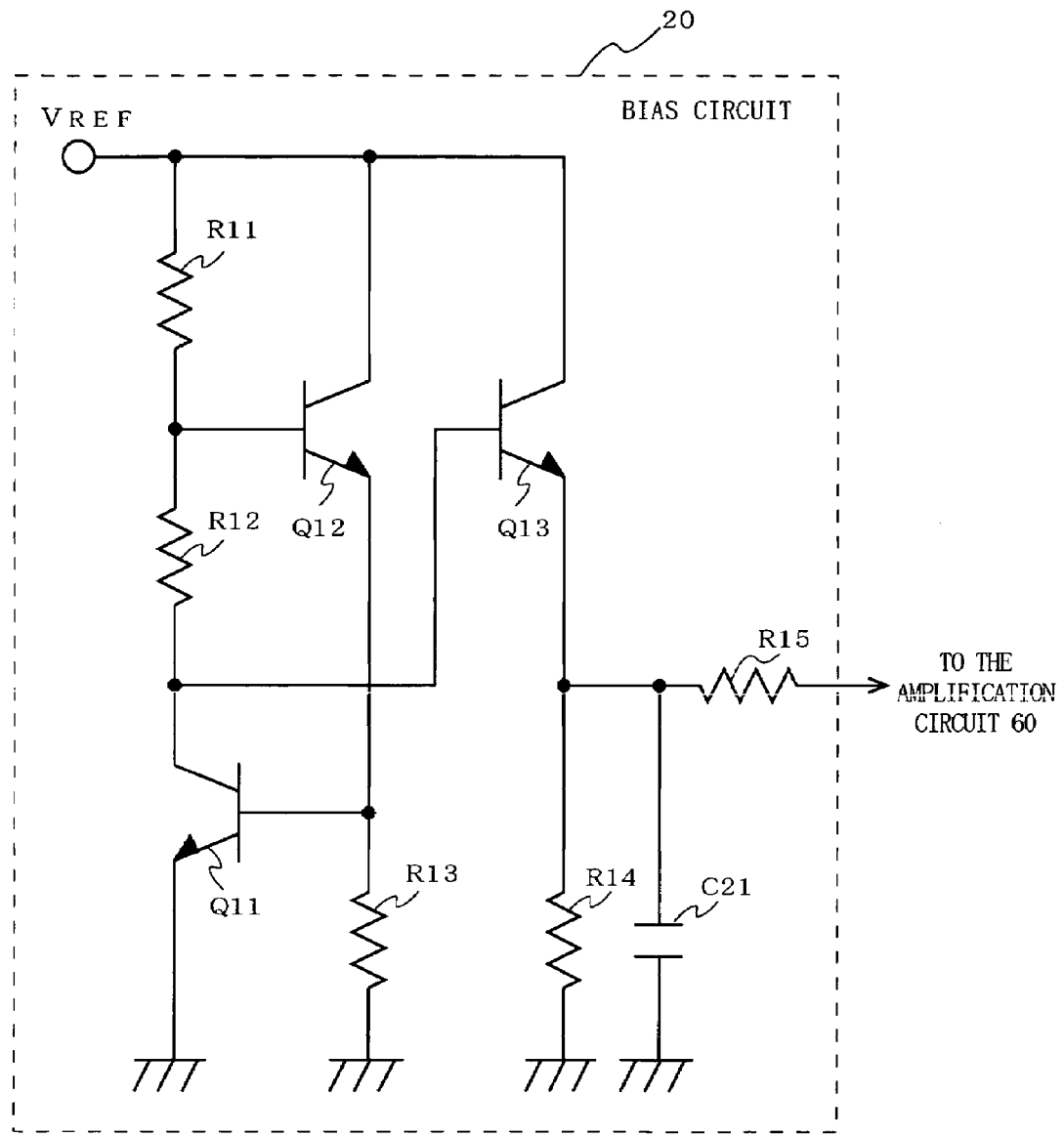
FIG. 4 is a circuit diagram of a bias circuit 20 showing a specific exemplary configuration of an attenuation filter F3.

FIG. 4 is a circuit diagram of the bias circuit 20 showing a specific exemplary configuration of the attenuation filter F3. In FIG. 4, the bias circuit 20 uses a capacitor C21 and a resistor R15 as the attenuation filter F3. In the bias circuit 20 shown in FIG. 4, the emitter of the transistor Q13 is grounded via the capacitor C21. As a result, the frequency fH component of the bias current is attenuated. The bias current is supplied from the emitter of the transistor Q13 to the amplification circuit 60 via the resistor R15. As a result, the frequency fL component of the bias current is attenuated.

Third Embodiment

Figure 5:
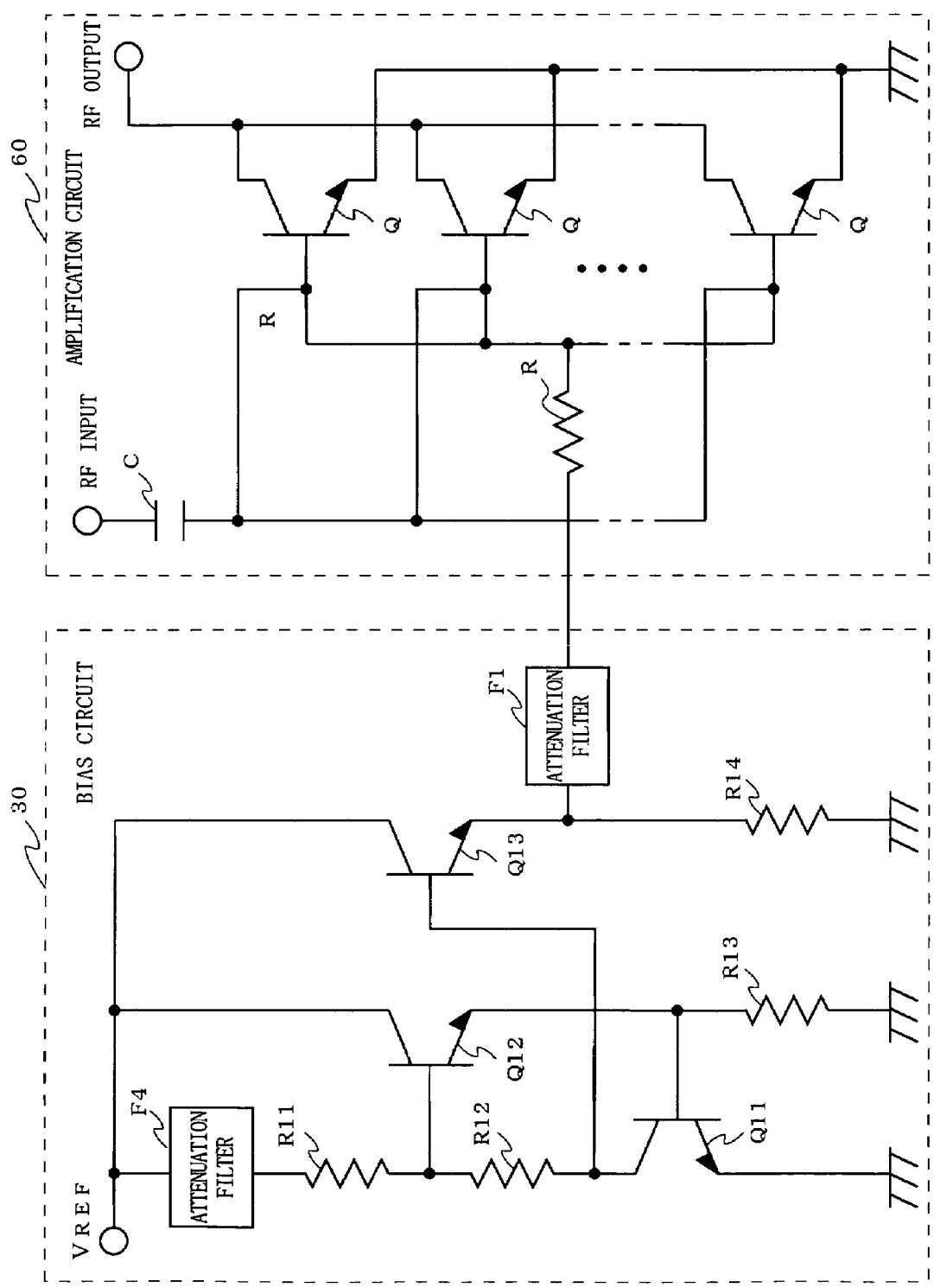
FIG. 5 shows a circuit configuration of an RF power amplifier according to a third embodiment of the present invention.

FIG. 5 shows a circuit configuration of an RF power amplifier according to a third embodiment of the present invention. In FIG. 5, the RF power amplifier according to the third embodiment includes a bias circuit 30 and an amplification circuit 60. The bias circuit 30 may have any basic configuration which uses a transistor such as an emitter follower or the like in a buffer stage, like the bias circuit 10.

The bias circuit 30 includes transistors Q11 through Q13, resistors R11 through R14, and attenuation filters F1 and F4. A bias source includes the transistors Q11 and Q12, the resistors R11 through R13, and the attenuation filter F4. A bias current to be supplied to the amplification circuit 60 is drawn out of a collector of the transistor Q11 of the bias source. The drawn-out bias current is input to a base of the transistor Q13 and is output from an emitter of the transistor Q13. The bias current output from the emitter of the transistor Q13 is supplied to the amplification circuit 60 via the attenuation filter F1.

The attenuation filter F1 is for attenuating a component of the frequency fL which is a difference frequency between the receiving frequency fr and the transmission frequency ft of a radio frequency signal. The attenuation filter F1 is, for example, a high pass filter for passing a frequency component higher than the frequency fL. The attenuation filter F4 is for attenuating a component of the frequency fH which is lower than the transmission frequency ft by the difference frequency fL. The attenuation filter F4 is, for example, a low pass filter for passing a frequency component lower than the frequency fH. The attenuation filters F1 and F4 pass a DC component.

Figure 6A:
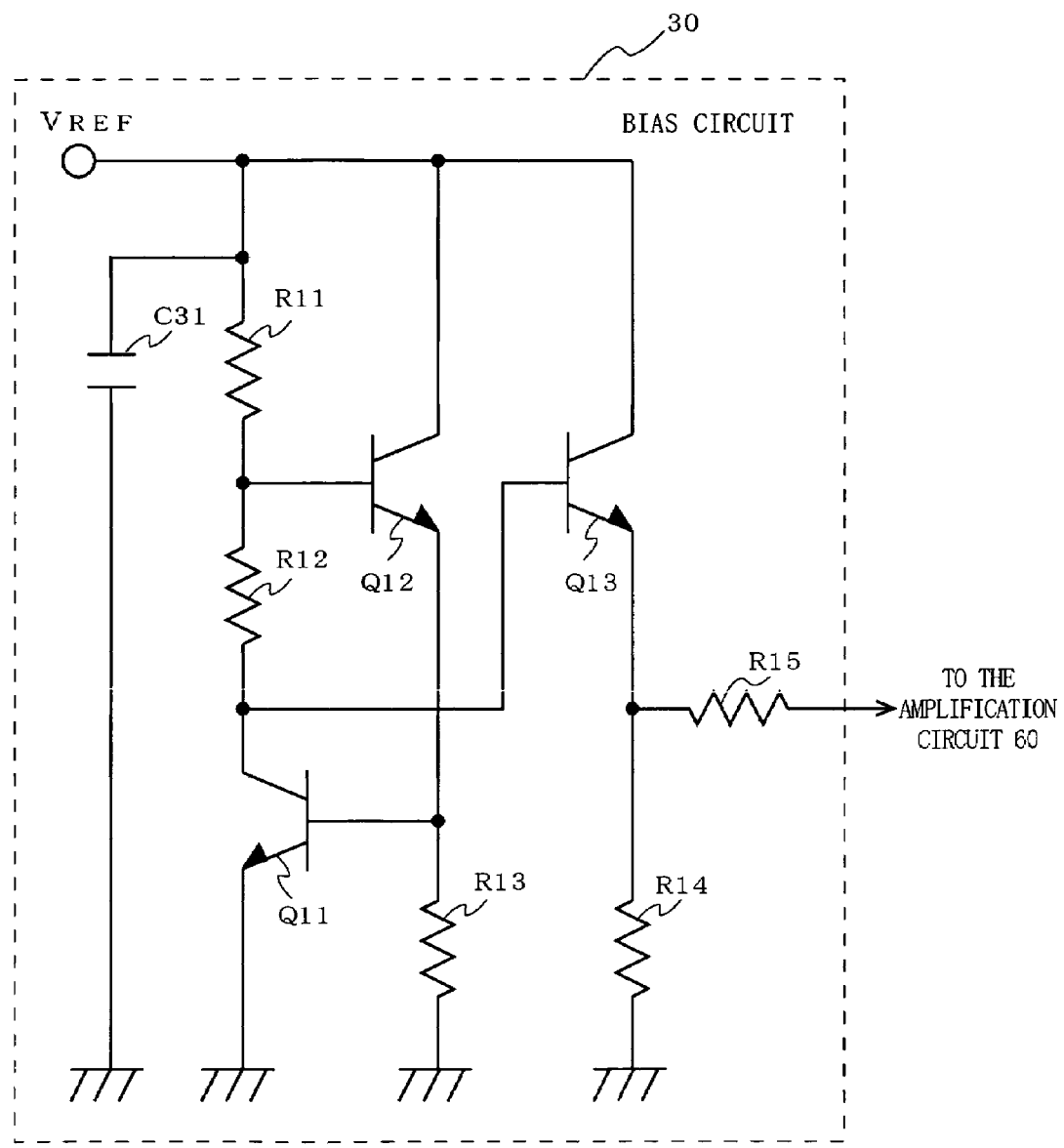
FIG. 6A and FIG. 6B are each a circuit diagram of a bias circuit 30 showing a specific exemplary configuration of attenuation filters F1 and F4.
Figure 6B:
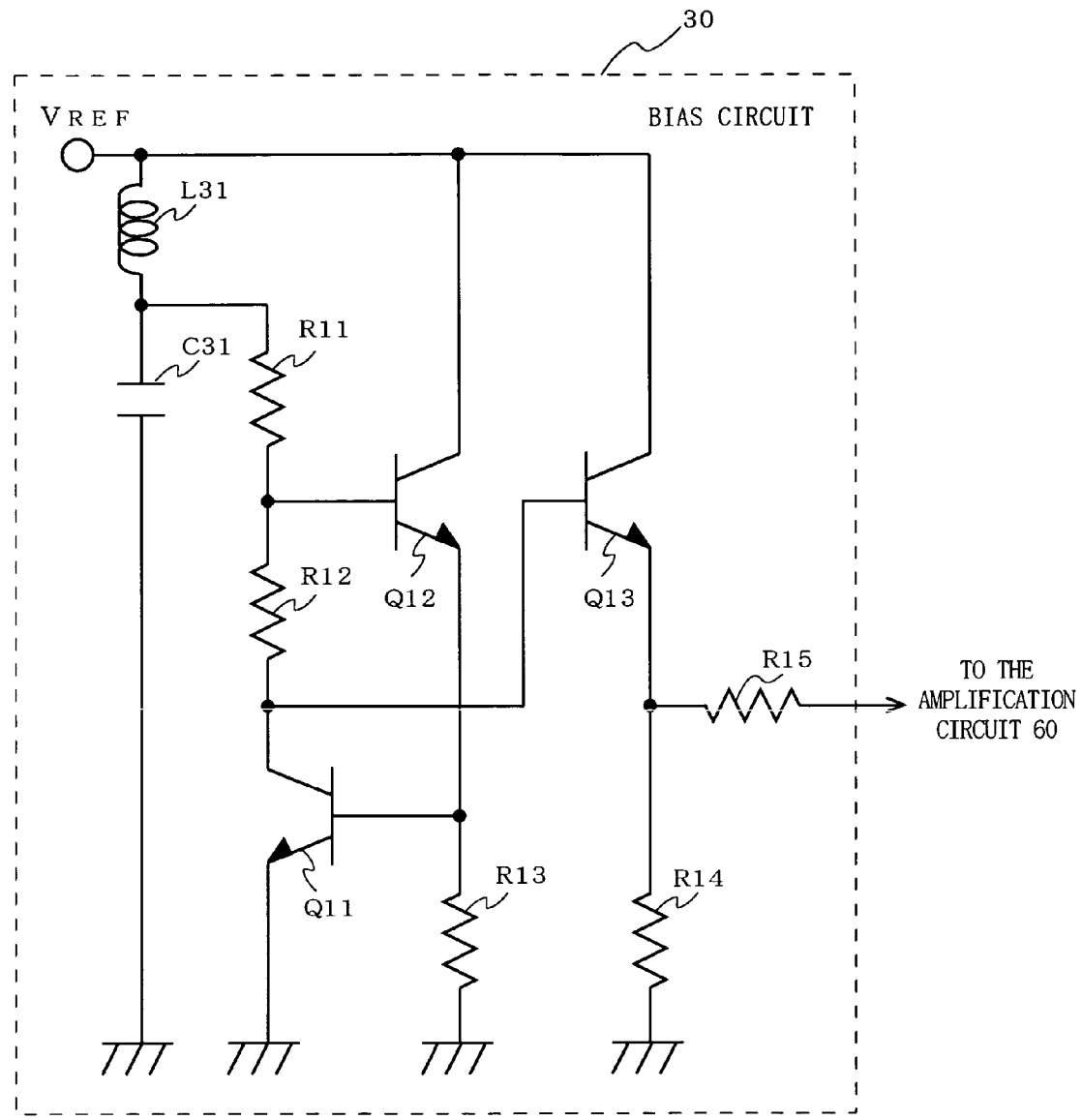

FIG. 6A and FIG. 6B are each a circuit diagram of the bias circuit 30 showing a specific exemplary configuration of the attenuation filters F1 and F4.

In FIG. 6A, the bias circuit 30 uses a resistor R15 as attenuation filter F1 and a capacitor C31 as the attenuation filter F4. In the bias circuit 30 shown in FIG. 6A, a connection point between the resistor R11 and a power supply VREF is grounded via the capacitor C31. As a result, the frequency fH component of the bias current is attenuated. The bias current is supplied from the emitter of the transistor Q13 to the amplification circuit 60 via the resistor R15. As a result, the frequency fL component of the bias current is attenuated.

In FIG. 6B, the bias circuit 30 uses a resistor R15 as attenuation filter F1 and an inductor L31 and a capacitor C31 as the attenuation filter F4. In the bias circuit 30 shown in FIG. 6B, the resistor R11 and a power supply VREF are connected to each other via the inductor L31, and a connection point been the inductor L31 and the resistor R11 is grounded via the capacitor C31. As a result, the frequency fH component of the bias current is attenuated. The bias current is supplied from the emitter of the transistor Q13 to the amplification circuit 60 via the resistor R15. As a result, the frequency fL component of the bias current is attenuated.

Fourth Embodiment

Figure 7:
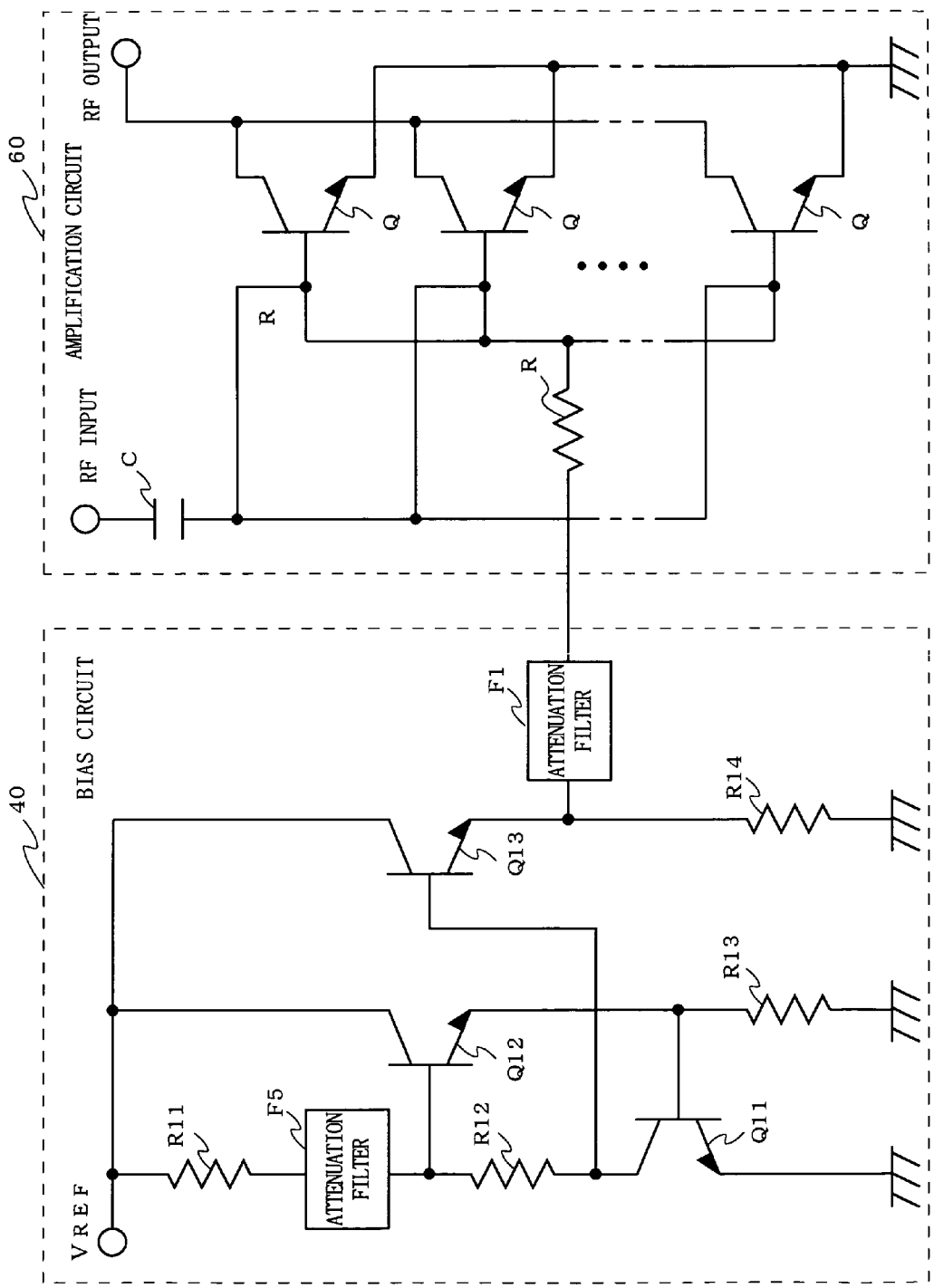
FIG. 7 shows a circuit configuration of an RF power amplifier according to a fourth embodiment of the present invention.

FIG. 7 shows a circuit configuration of an RF power amplifier according to a fourth embodiment of the present invention. In FIG. 7, the RF power amplifier according to the fourth embodiment includes a bias circuit 40 and an amplification circuit 60. The bias circuit 40 may have any basic configuration which uses a transistor such as an emitter follower or the like in a buffer stage, like the bias circuit 10.

The bias circuit 40 includes transistors Q11 through Q13, resistors R11 through R14, and attenuation filters F1 and F5. A bias source includes the transistors Q11 and Q12, the resistors R11 through R13, and the attenuation filter F5. A bias current to be supplied to the amplification circuit 60 is drawn out of a collector of the transistor Q11 of the bias source. The drawn-out bias current is input to a base of the transistor Q13 and is output from an emitter of the transistor Q13. The bias current output from the emitter of the transistor Q13 is supplied to the amplification circuit 60 via the attenuation filter F1.

The attenuation filter F1 is for attenuating a component of the frequency fL which is a difference frequency between the receiving frequency fr and the transmission frequency ft of a radio frequency signal. The attenuation filter F1 is, for example, a high pass filter for passing a frequency component higher than the frequency fL. The attenuation filter F5 is for attenuating a component of the frequency fH which is lower than the transmission frequency ft by the difference frequency fL. The attenuation filter F5 is, for example, a low pass filter for passing a frequency component lower than the frequency fH. The attenuation filters F1 and F5 pass a DC component.

Figure 8:
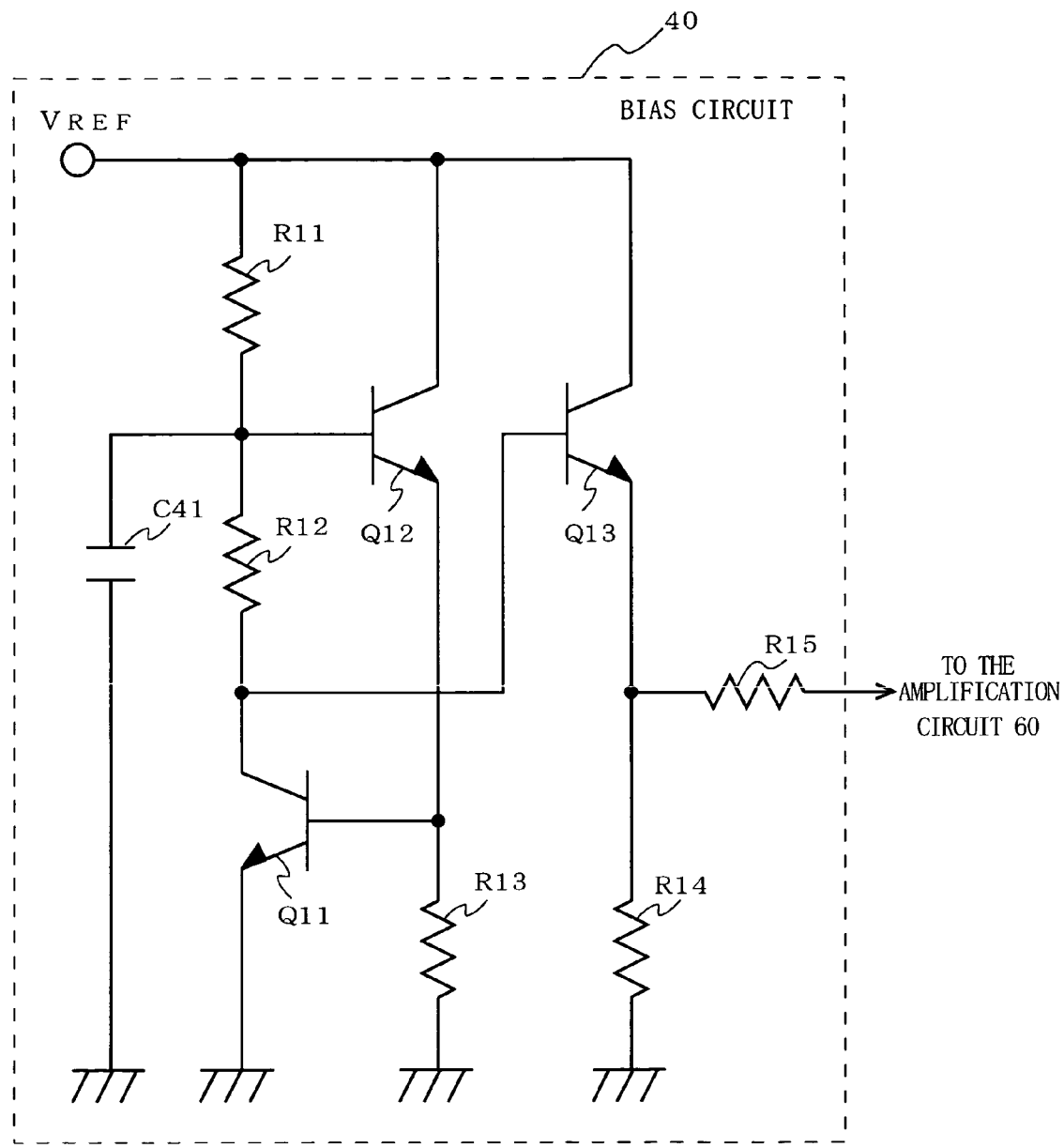
FIG. 8 is a circuit diagram of a bias circuit 40 showing a specific exemplary configuration of attenuation filters F1 and F5.

FIG. 8 is a circuit diagram of the bias circuit 40 showing a specific exemplary configuration of the attenuation filters F1 and F5. In FIG. 8, the bias circuit 40 uses a resistor R15 as the attenuation filter F1 and a capacitor C41 as the attenuation filter F5. In the bias circuit 40 shown in FIG. 8, a connection point between the resistor R11 and the resistor R12 is grounded via the capacitor C41. As a result, the frequency fH component of the bias current is attenuated. The bias current is supplied from the emitter of the transistor Q13 to the amplification circuit 60 via the resistor R15. As a result, the frequency fL component of the bias current is attenuated.

Fifth Embodiment

Figure 9:
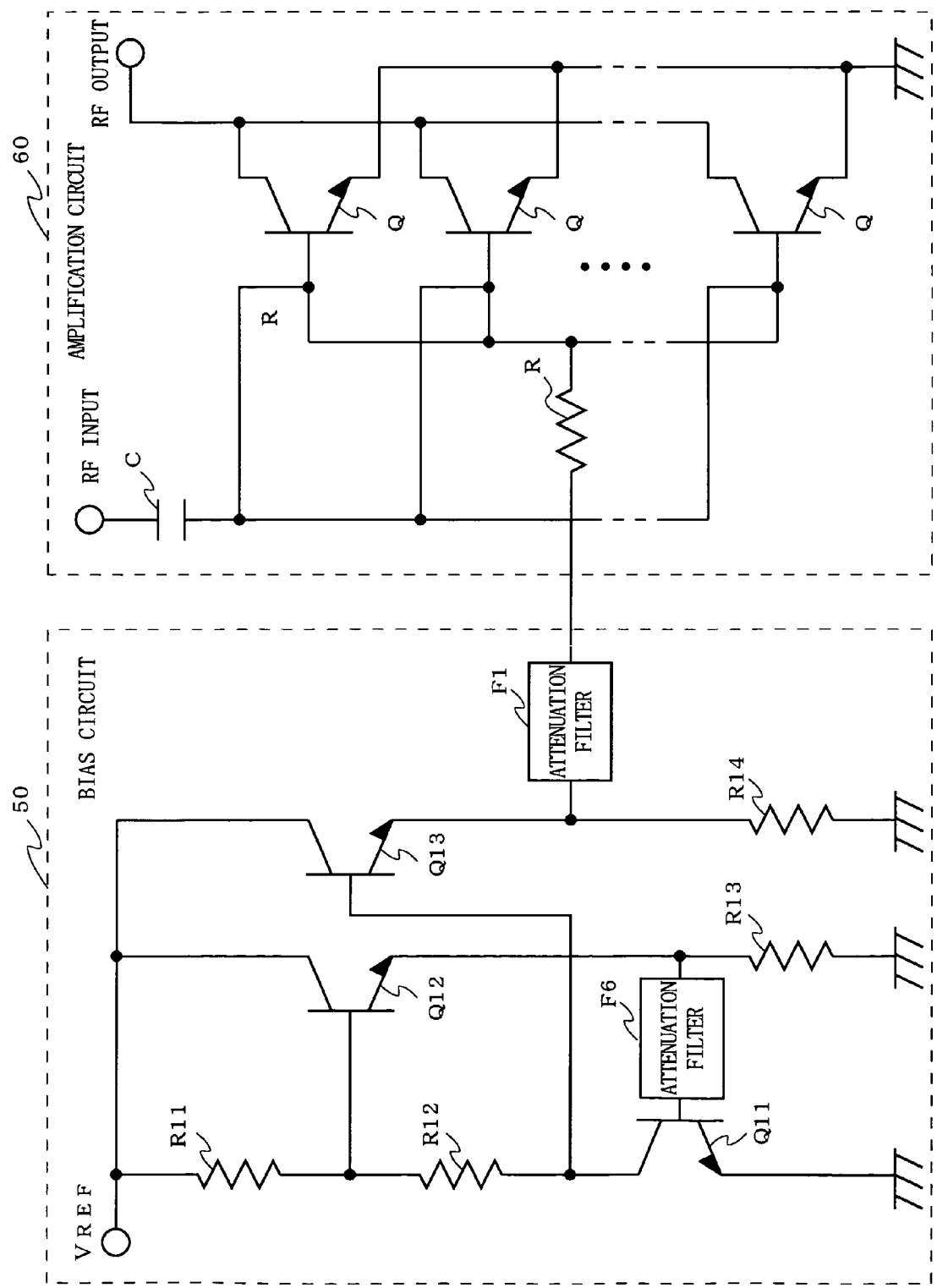
FIG. 9 shows a circuit configuration of an RF power amplifier according to a fifth embodiment of the present invention.

FIG. 9 shows a circuit configuration of an RF power amplifier according to a fifth embodiment of the present invention. In FIG. 9, the RF power amplifier according to the fifth embodiment includes a bias circuit 50 and an amplification circuit 60. The bias circuit 50 may have any basic configuration which uses a transistor such as an emitter follower or the like in a buffer stage, like the bias circuit 10.

The bias circuit 50 includes transistors Q11 through Q13, resistors R11 through R14, and attenuation filters F1 and F6. A bias source includes the transistors Q11 and Q12, the resistors R11 through R13, and the attenuation filter F6. A bias current to be supplied to the amplification circuit 60 is drawn out of a collector of the transistor Q11 of the bias source. The drawn-out bias current is input to a base of the transistor Q13 and is output from an emitter of the transistor Q13. The bias current output from the emitter of the transistor Q13 is supplied to the amplification circuit 60 via the attenuation filter F1.

The attenuation filter F1 is for attenuating a component of the frequency fL which is a difference frequency between the receiving frequency fr and the transmission frequency ft of a radio frequency signal. The attenuation filter F1 is, for example, a high pass filter for passing a frequency component higher than the frequency fL. The attenuation filter F6 is for attenuating a component of the frequency fH which is lower than the transmission frequency ft by the difference frequency fL. The attenuation filter F6 is, for example, a low pass filter for passing a frequency component lower than the frequency fH. The attenuation filters F1 and F6 pass a DC component.

Figure 10A:
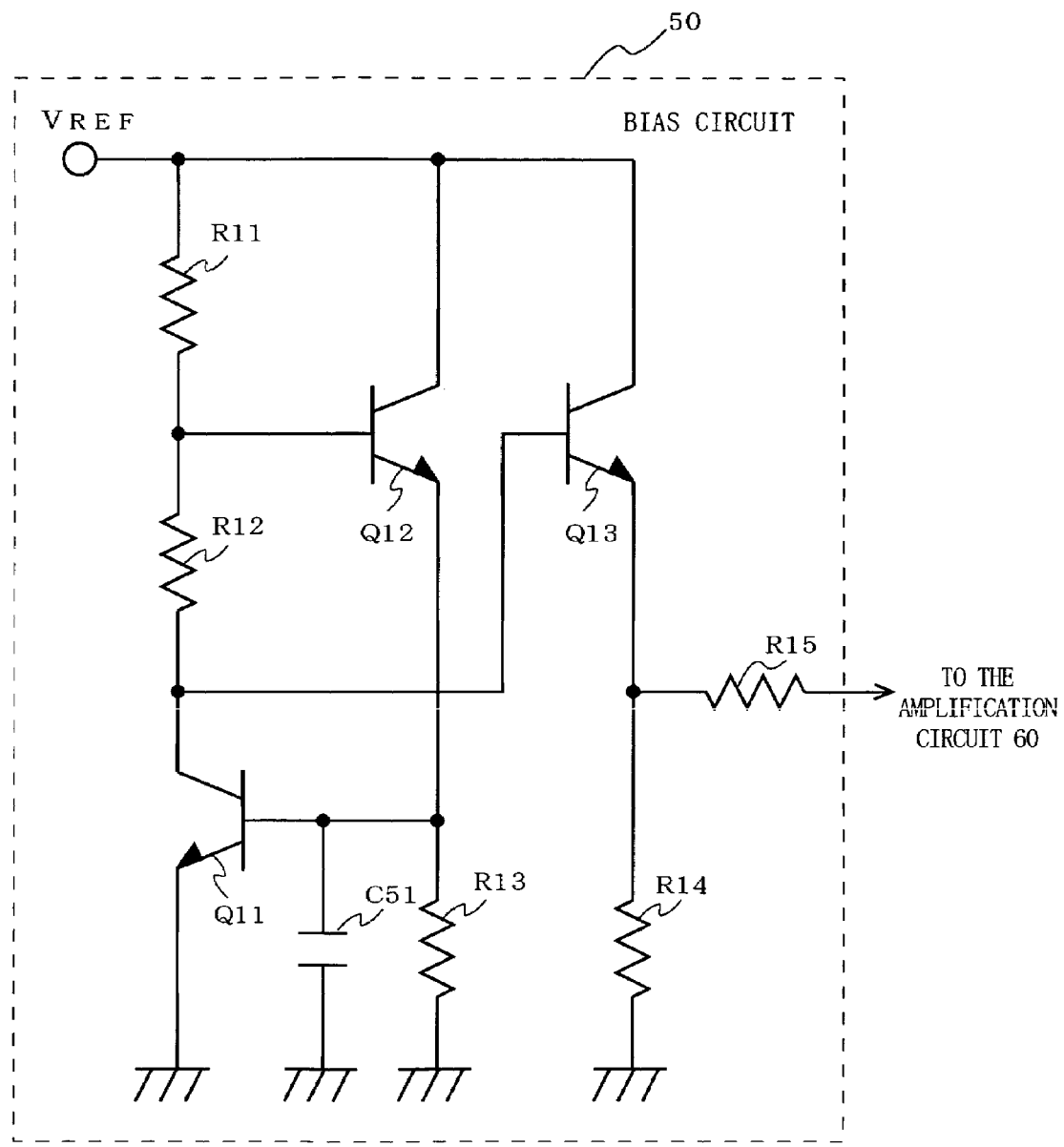
FIG. 10A and FIG. 10B are each a circuit diagram of a bias circuit 50 showing a specific exemplary configuration of attenuation filters F1 and F6.
Figure 10B:
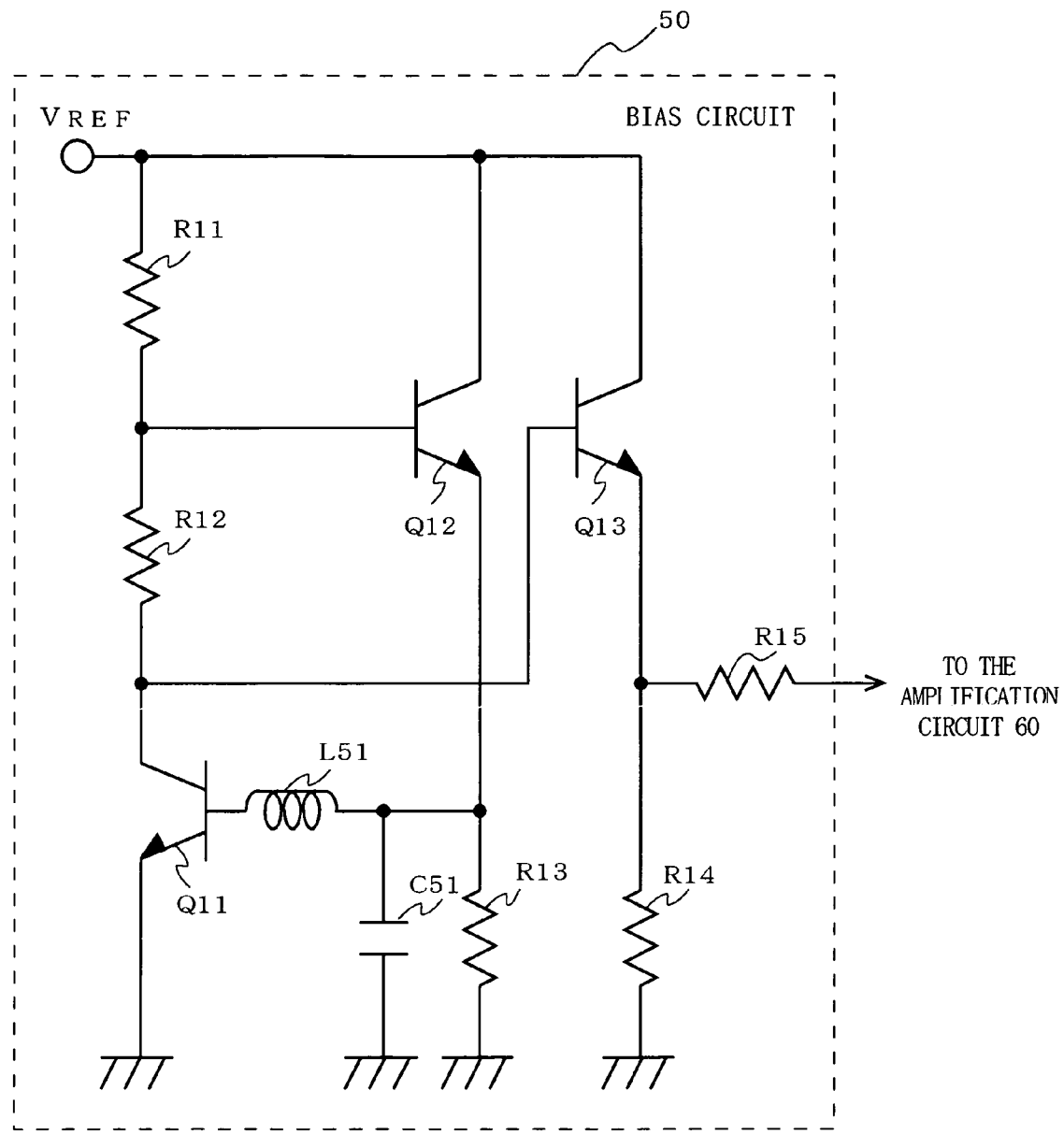

FIG. 10A and FIG. 10B are each a circuit diagram of the bias circuit 50 showing a specific exemplary configuration of the attenuation filters F1 and F6.

In FIG. 10A, the bias circuit 50 uses a resistor R15 as attenuation filter F1 and a capacitor C51 as the attenuation filter F6. In the bias circuit 50 shown in FIG. 10A, a base of the transistor Q11 is grounded by the capacitor C51. As a result, the frequency fH component of the bias current is attenuated. The bias current is supplied from the emitter of the transistor Q13 to the amplification circuit 60 via the resistor R15. As a result, the frequency fL component of the bias current is attenuated.

In FIG. 10B, the bias circuit 50 uses a resistor R15 as attenuation filter F1 and an inductor L51 and a capacitor C51 as the attenuation filter F6. In the bias circuit 50 shown in FIG. 10B, a base of the transistor Q11 and an emitter of the transistor Q12 are connected to each other via the inductor L51, and the emitter of the transistor Q12 is grounded by the capacitor C51. As a result, the frequency fH component of the bias current is attenuated. The bias current is supplied from the emitter of the transistor Q13 to the amplification circuit 60 via the resistor R15. As a result, the frequency fL component of the bias current is attenuated.

Figure 11:
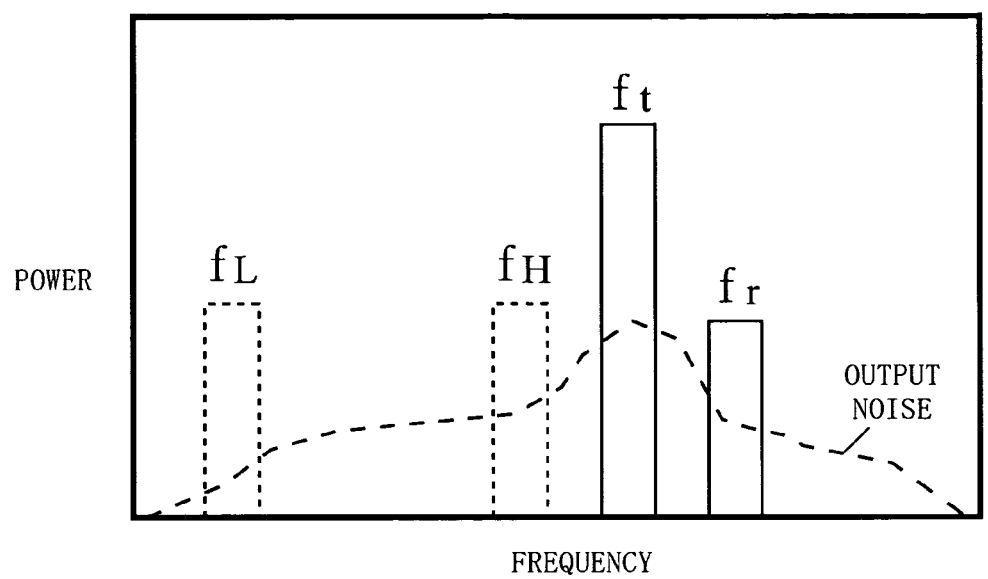
FIG. 11 is a graph illustrating the relationship between the transmission frequency ft/receiving frequency fr and the output noise in an RF power amplifier according to the present invention.
Figure 12:
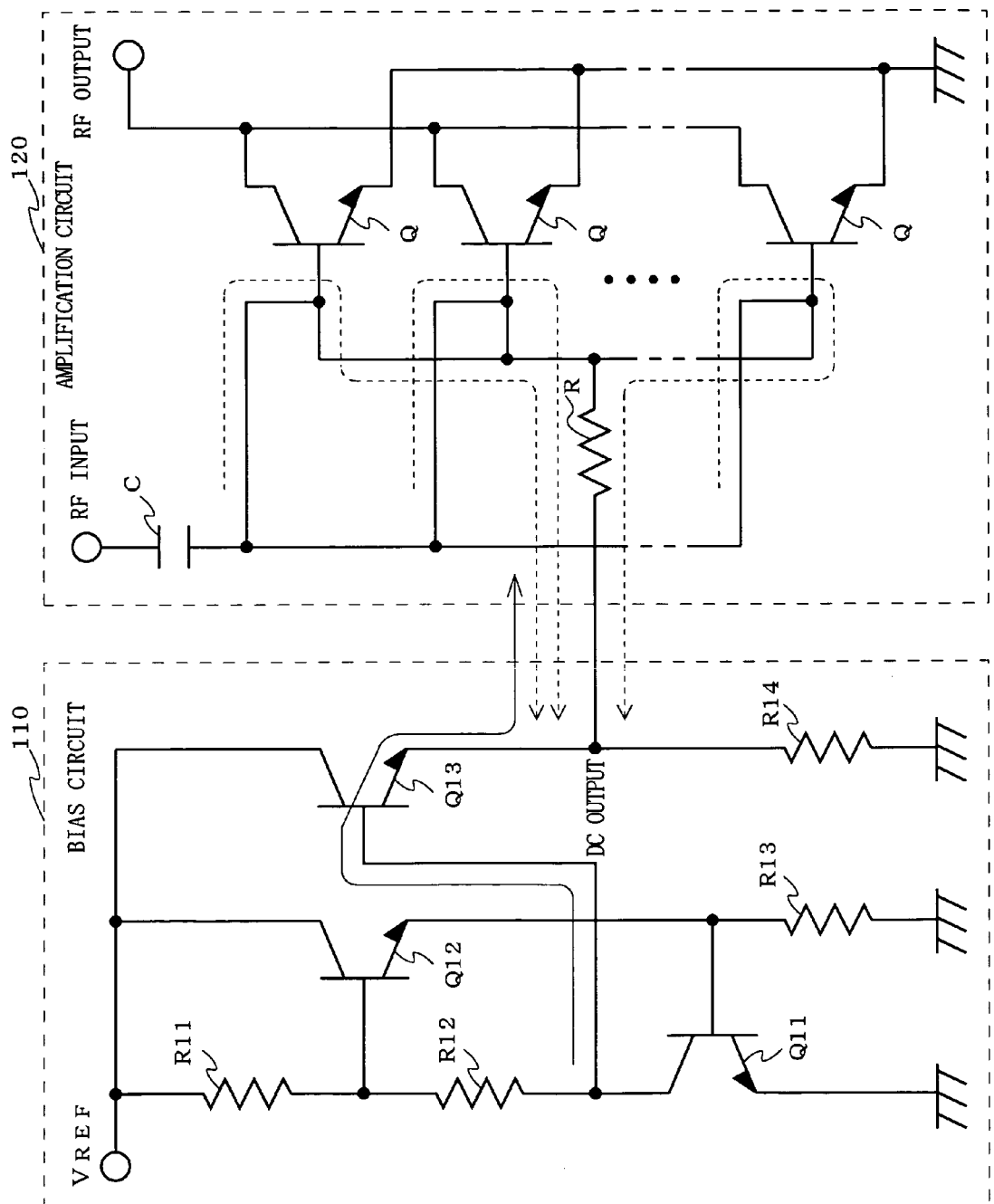
FIG. 12 shows a circuit configuration of a conventional RF power amplifier.
Figure 13:
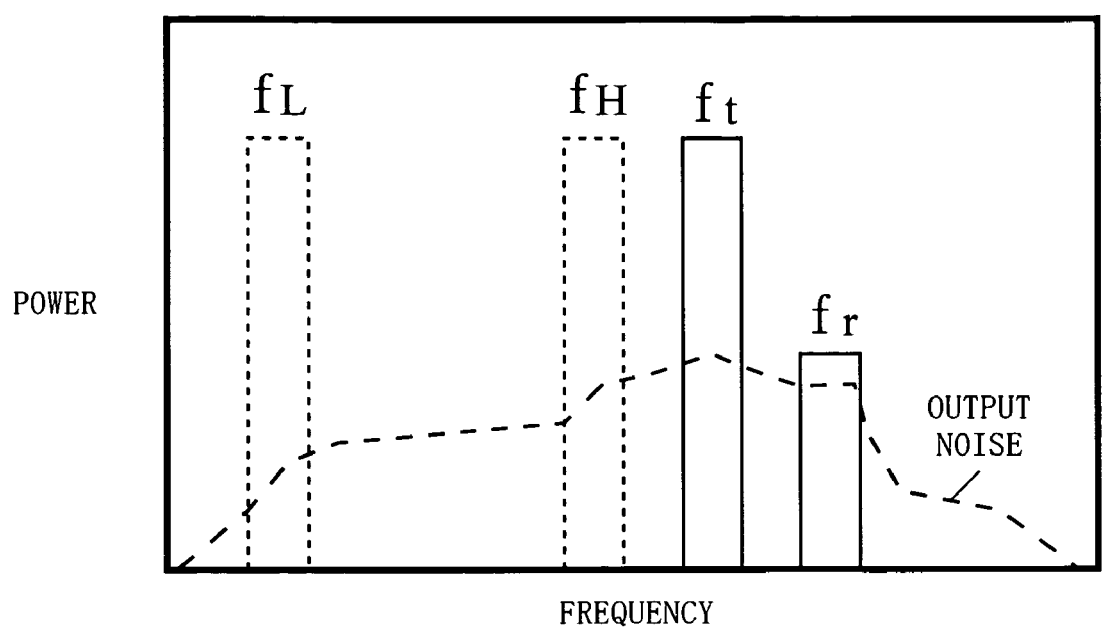
FIG. 13 is a graph illustrating the relationship between the transmission frequency ft/receiving frequency fr and the output noise in the conventional RF power amplifier.

As described above, in the RF power amplifier according to each of the first through fifth embodiments of the present invention, an attenuation filter(s), for attenuating a component of the frequency fL which is a difference frequency between the receiving frequency fr and the transmission frequency ft of a radio frequency signal and a component of the frequency fH which is lower than the transmission frequency ft by the difference frequency fL, is (are) incorporated into the bias circuit. Owing to such a configuration, as shown in FIG. 11, the output noise of the RF power amplifier in the band of the receiving frequency fr can be reduced.

The positions at which the attenuation filters F1 through F6 are located and the combination of the attenuation filters F1 through F6 are not limited to those described in the above first through fifth embodiments, and may be freely designed in accordance with the purpose, the circuit scale or the like.

While the invention has been described in detail, the foregoing description is in all aspects illustrative and not restrictive. It is understood that numerous other modifications and variations can be devised without departing from the scope of the invention.

What is claimed is:

1. An RF power amplifier usable for an apparatus for transmitting and receiving a radio frequency signal, the RF power amplifier comprising:
    an amplification circuit including at least one transistor for receiving a radio frequency signal having a transmission frequency ft at a base thereof and amplifying and outputting the radio frequency signal from a collector thereof; and
    a bias circuit for supplying a bias current to the base of the transistor included in the amplification circuit as an output from an emitter follower;
    wherein the bias circuit includes a filter for attenuating at least either one of a component of a difference frequency fL (=|fr−ft|) between a receiving frequency fr and the transmission frequency ft of the radio frequency signal, and a component of a frequency fH (=2ft−fr) which is lower than the transmission frequency ft by the difference frequency fL.

2. An RF power amplifier according to claim 1, wherein the bias circuit comprises:
    a first transistor having an emitter which is grounded;
    a second transistor having a collector connected to a power supply and an emitter connected to a base of the first transistor;
    a first resistor for connecting a base of the second transistor to the power supply;
    a second resistor for connecting a collector of the first transistor and the base of the second transistor to each other;
    a third resistor for grounding the emitter of the second transistor;
    a third transistor having a collector connected to the power supply;
    a fourth resistor for grounding an emitter of the third transistor;
    a first attenuator provided between the emitter of the third transistor and the amplification circuit; and
    a second attenuator provided between the collector of the first transistor and a base of the third transistor.

3. An RF power amplifier according to claim 1, wherein the bias circuit comprises:
    a first transistor having an emitter which is grounded;
    a second transistor having a collector connected to a power supply and an emitter connected to a base of the first transistor;
    a first resistor for connecting a base of the second transistor to the power supply;
    a second resistor for connecting a collector of the first transistor and the base of the second transistor to each other;
    a third resistor for grounding the emitter of the second transistor;
    a third transistor having a collector connected to the power supply and a base connected to the collector of the first transistor;
    a fourth resistor for grounding an emitter of the third transistor;
    an attenuator provided between the emitter of the third transistor and the amplification circuit.

4. An RF power amplifier according to claim 1, wherein the bias circuit comprises:
- a first transistor having an emitter which is grounded;
- a second transistor having a collector connected to a power supply and an emitter connected to a base of the first transistor;
- a first resistor having one end connected to a base of the second transistor;
- a second resistor for connecting a collector of the first transistor and the base of the second transistor to each other;
- a third resistor for grounding the emitter of the second transistor;
- a third transistor having a collector connected to the power supply and a base connected to the collector of the first transistor;
- a fourth resistor for grounding an emitter of the third transistor;
- a first attenuator provided between the emitter of the third transistor and the amplification circuit; and
- a second attenuator provided between the other end of the first resistor and the power supply.

5. An RF power amplifier according to claim 1, wherein the bias circuit comprises:
- a first transistor having an emitter which is grounded;
- a second transistor having a collector connected to a power supply and an emitter connected to a base of the first transistor;
- a first resistor having one end connected to the power supply;
- a second resistor for connecting a collector of the first transistor and a base of the second transistor to each other;
- a third resistor for grounding the emitter of the second transistor;
- a third transistor having a collector connected to the power supply and a base connected to the collector of the first transistor;
- a fourth resistor for grounding an emitter of the third transistor;
- a first attenuator provided between the emitter of the third transistor and the amplification circuit; and
- a second attenuator provided between the other end of the first resistor and the base of the second transistor.

6. An RF power amplifier according to claim 1, wherein the bias circuit comprises:
- a first transistor having an emitter which is grounded;
- a second transistor having a collector connected to a power supply;
- a first resistor for connecting a base of the second transistor to the power supply;
- a second resistor for connecting a collector of the first transistor and the base of the second transistor to each other;
- a third resistor for grounding an emitter of the second transistor;
- a third transistor having a collector connected to the power supply and a base connected to the collector of the first transistor;
- a fourth resistor for grounding an emitter of the third transistor;
- a first attenuator provided between the emitter of the third transistor and the amplification circuit; and
- a second attenuator provided between a base of the first transistor and the emitter of the second transistor.

* * * * *